United States Patent [19]
So et al.

[11] Patent Number: 5,856,982
[45] Date of Patent: Jan. 5, 1999

[54] HIGH-SPEED DISTURB TESTING METHOD AND WORD LINE DECODER IN SEMICONDUCTOR MEMORY DEVICE

[75] Inventors: Byung-se So, Seoul; Jin-ho So, Seongnam; Woo-seop Kim, Seoul; Dal-jo Lee, Suwon, all of Rep. of Korea

[73] Assignee: Samsung Electronics, Co., Ltd., Suwon, Rep. of Korea

[21] Appl. No.: 773,787

[22] Filed: Dec. 24, 1996

[30] Foreign Application Priority Data

Dec. 29, 1995 [KR] Rep. of Korea ................. 1995/64207

[51] Int. Cl.$^6$ .................................................. G11C 29/00
[52] U.S. Cl. .......................................... 371/21.1; 365/201
[58] Field of Search ................................... 371/21.1, 21.2, 371/22.35, 25.1, 27.5, 28; 365/201, 189.03, 230.06, 189.05, 189.04; 395/183.18, 183.01, 182.19, 182.04

[56] References Cited

U.S. PATENT DOCUMENTS

| 5,079,744 | 1/1992 | Tobita et al. ........................... 365/201 |
| 5,289,475 | 2/1994 | Slemmer ................................ 371/21.1 |
| 5,455,796 | 10/1995 | Inui et al. .............................. 365/201 |
| 5,483,488 | 1/1996 | Sanada ............................... 365/189.03 |
| 5,519,659 | 5/1996 | Tanida et al. ........................... 365/201 |
| 5,574,693 | 11/1996 | Inui et al. .............................. 365/201 |
| 5,629,943 | 5/1997 | McClure ............................... 371/21.1 |
| 5,666,317 | 9/1997 | Tanida et al. ........................... 365/201 |

*Primary Examiner*—Robert W. Beausoliel, Jr.
*Assistant Examiner*—Nadeem Iqbal
*Attorney, Agent, or Firm*—Marger, Johnson, McCollom, P.C.

[57] ABSTRACT

A high-speed disturb testing method for a semiconductor memory device is disclosed, includes the steps of: (a) writing first piece of data in all of the memory cells in the memory cell array; (b) reading and confirming the first piece data written in each memory cell of the memory cell array; (c) writing second piece data in all of the memory cells connected to the plurality of disturb word lines; (d) reading and confirming the second piece data from all of the memory cells (e) fixing the mode of the disturb word line to the test mode; (f) repeatedly writing the second piece data in all of the memory cells connected to the plurality of disturb word lines; (g) changing the test mode to the normal mode; (h) refreshing all of the memory cells; (i) reading and confirming the first piece data from a word line located close to the selected plurality of disturb word lines; (j) writing the first piece data in all of memory cells connected to the plurality of disturb word lines; (k) repeating the steps (3) to (10), to thereby apply disturb to all of the word lines one by one; and (l) reading and confirming the first piece data from the memory cell array.

11 Claims, 6 Drawing Sheets

HIGH-SPEED DISTURB TESTING METHOD AND WORD LINE DECODER IN SEMICONDUCTOR MEMORY DEVICE

BACKGROUND OF THE INVENTION

1. Field of the Invention

The present invention relates to a semiconductor memory device and, more particularly, to a word line decoder and high-speed disturb testing method, which is for the purpose of reducing the time required for the disturb test.

2. Description of the Related Art

The development of a semiconductor fabrication technique realizes smaller but more complicated circuits. Thus, a memory device is becoming more dense as the number of memory cell per unit area is increased. However, this plane and vertical decrease of the memory device requires more complicated and precise fabrication process, and thus the memory device accomplished by this process needs a complicated test requiring longer time in order to guarantee its reliability and quality. Practically, the performance of a memory device cannot be guaranteed even though its memory cell passes a test of reading or writing data "1" or "0". Complicated and densely arranged memory cells of a highly integrated memory device may become poor due to the interaction between them. How much the interaction affects the memory device depends on various causes such as memory structure, addressing circuit, the amount of substrate resistance, characteristic and structure of a memory cell or variation in the fabrication process. As a result, defects in memory devices appear in various types, and a test for screening these defects becomes various and complicated. This requires longer test time.

As a typical memory testing method, march test or checker board test is known. The disturb test shown in FIG. 1 approves itself effective for screening the defects of DRAM, and thus it is widely used. The disturb test can screen the soft error which inverts data of neighboring cell from "1" to "0" in case that all memory cells are functionally normally operated but have the disturb as shown in FIG. 1, which means repeatedly accessing the same address data. The most important condition of the disturb test is that a word line is repeatedly activated when data "0" is stored in the disturb cell and its neighboring cells have data "1".

FIG. 2 is a cross-sectional view showing the mechanism of the disturb test. Referring to FIG. 2, when a silicon pit 20 is generated in a gate oxide 10 due to a particle, transistors are normally operated but electron impact ionization occurs according to a high electric field in the silicon pit, to thereby generate holes and electrons. These holes move toward a substrate 100, and produce an ohmic drop in the substrate. Then, a substrate voltage partially increased according to the ohmic drop makes a bit line 30 grounded at 0V forward bias. By doing so, minor carriers of electrons are injected from bit line 30 into substrate 100. Thereafter, the electrons are transmitted and united with holes in a neighboring cell having data "1", thereby generating a cell leakage current. As a result, the soft error is induced. Furthermore, in case that the disturb is applied for a longer time, the gradual propagation of the error in a radial manner can be easily explained with regard to the fact that the electrons injected from the bit line are radially diffused.

As described above, the disturb test is based on the fact that the bit line becomes forward-biased according to the partial increase of the substrate voltage in case that the word line is repeatedly activated at a state that a predetermined data pattern is maintained. Here, it should be noted that poor cells are locally produced, and two poor cells having a distance from each other do not interfere to each other. Moreover, it is important that the word line is activated without regard to reading and writing data "0".

However, in the aforementioned conventional disturb test, the time required for the test is very long because the same word line should be repeatedly activated. It is desirable that test time becomes short in order to secure competitiveness in the highly integrated memory device production. In the fabrication of the semiconductor memory device, its fabrication cost is fixed owing to the development of the fabrication process regardless of increase in integration. However, the increased integration also increases the number of cell to be tested, and thus the test time becomes longer. This raises the cost required for the test.

Practically, in case that the aforementioned disturb test is applied for a highly integrated memory device such as 64M or 256M DRAM, the total test time is so long that the test is difficult to apply in terms of its fabrication cost. On the other hand, in the highly integrated memory device, since the density of its memory cells is increased, the same kind of error occurs frequently.

SUMMARY OF THE INVENTION

An object of the present invention is to provide a method of disturb-testing a semiconductor memory device at a higher speed.

Another object of the present invention is to provide a word line decoder of a semiconductor memory device, which can select one or multiple word lines according to a mode.

A still another object of the present invention is to provide a disturb testing method which reduces its test time by selecting a plurality of word lines simultaneously.

A further object of the present invention is to provide a word line decoder which prevents the excessive peak current from flowing due to simultaneous operation of a lot of sense amplifiers in case that a plurality of word lines are simultaneously selected.

Another object of the present invention is to provide a word line decoder which writes data according to one-time operation in case that the same data is written to the same bit line in a plurality of memory cells by selecting a plurality of word lines of a semiconductor.

To accomplish the objects of the present invention, there is provided a high-speed disturb testing method for a semiconductor memory device, in which a normal or test mode is determined by selecting a disturb word line from word lines connected to memory cells in a memory cell array in response to the input of an external address in order to test if the memory cell is poor or not, the method including the steps of: (a) writing first piece of data in all of the memory cells in the memory cell array; (b) reading and confirming the first piece data written in each memory cell of the memory cell array; (c) writing second piece data in all of the memory cells connected to the plurality of disturb word lines; (d) reading and confirming the second piece data from all of the memory cells (e) fixing the mode of the disturb word line to the test mode; (f) repeatedly writing the second piece data in all of the memory cells connected to the plurality of disturb word lines; (g) changing the test mode to the normal mode; (h) refreshing all of the memory cells; (i) reading and confirming the first piece data from a word line located close to the selected plurality of disturb word lines; (j) writing the first piece data in all of memory cells connected to the plurality of disturb word lines; (k) repeating the steps (3) to (10), to thereby apply disturb to all of the word lines one by one; and (l) reading and confirming the first piece data from the memory cell array.

BRIEF DESCRIPTION OF THE DRAWINGS

FIG. 1 is a flow chart of a conventional disturb test;

FIG. 2 is a cross-sectional view showing the mechanism of the disturb test;

FIG. 3 is a block diagram of a word line decoder according to the present invention;

FIG. 4 is a block diagram of a pre-decoder according to an embodiment of the present invention;

FIG. 5 shows an embodiment of the decoder of FIG. 3;

FIG. 6 is a timing diagram of an operation for the purpose of selecting a test mode according to the present invention; and FIG. 7 is a flow chart of a high-speed disturb test according to the present invention.

DETAILED DESCRIPTION OF THE PREFERRED EMBODIMENT

Reference will now be made in detail to the preferred embodiment of the present invention, examples of which are illustrated in the accompanying drawings.

The present invention provides a new high-speed disturb testing method for the purpose of reducing the time required for the disturb test which is effective but needs longer test time. Since the conventional disturb test is performed in such a manner that one word line is disturbed at one time, WXN times activation of the word line is required if each word line is activated N times in case of W word lines. However, in the high-speed disturb test according to the present invention, $2^a$ (in case that a address input is ignored) word lines are simultaneously disturbed by don't-care-processing a high-speed disturb selection circuit. By doing so, the whole disturbance can be reduced by $2^a$.

FIG. 3 is a block diagram of a word line decoder of a conventional memory device. Referring to FIG. 3, the word line decoder receives four address inputs (A0 to A3) and selects one of sixteen combinations of word line. Conventionally, the decoding passes through two stages of pre-decoder 3 and 5 and main decoder 7. Then, an activation signal is sent from main decoder 7 to sixteen word lines W0 to W15 as a decoded address signal.

FIG. 4 is an embodiment of a pre-decoder of a memory device according to the present invention. A high-speed disturb selection circuit 100 is located inside of pre-decoder 5. FIG. 5 is an embodiment of the main decoder of FIG. 3. Referring to FIG. 5, the decoder drives one of sixteen word lines W0 to W15 by receiving four address inputs A0 to A3.

The memory device according to the present invention has two modes: one is a normal mode for general reading and writing; the other is a test mode for a high-speed test. The test mode is constructed in a manner that a plurality of word lines are selected by ignoring the input of a specific address pin. In FIG. 4, when output Q of a flip-flop 9 is "0", the decoder is in the normal mode, and the decoder is operated in the test mode if output Q is "1". When the decoder is operated in the normal mode, the operation of pre-decoder 3 is the same as a general decoder. Thus, only one output is selected. Since pre-decoders 3 and 5 respectively have four output cases, decoder 7 selects one of sixteen input combinations. Accordingly, only one word line is selected, and thus the decoder is operated as a general row decoder in the normal mode.

On the other hand, since lines T0 and T1 are "1" in the test mode, pre-decoded addresses B0 and B2 or B1 and B3 are selected according to the value of address A2. In case that the output of the pre-decoder is applied to decoder 7 of FIG. 5, two word lines are simultaneously selected in a manner of (W0,W8), (W1,W9), . . . , (W7,W15) according to the addresses C0 to C3. Accordingly, only eight address combinations are considered in order to disturb sixteen word lines. This reduces the total disturbing time by a half the conventional one.

If high-speed disturb selection circuit 100 is also added to address A2 similar to address A3, four word lines are selected in a manner of (W0,W4,W8,W12), (W1,W5,W9, W13), . . . ,(W3,W7,W11,W15). In this case, the total disturb time is reduced by one fourths. Furthermore, if the high-speed disturb selection circuit is added to address A0, two word lines are simultaneously selected. However, the word lines simultaneously selected are close to each other. Thus, it is not possible to prevent the interference between the disturbed word lines.

FIG. 6 is a timing diagram of an operation for an external signal in order to change the test mode in the high-speed disturb selection circuit. The change of the test mode is accomplished by changing the value of flip-flop 9 of FIG. 3. The test mode is changed in such a manner that flip-flop 9 of high-speed disturb selection circuit 100 is enabled by enabling a column address strobe signal (CASB) and write enable signal(WEB) from a logic "high" to "low" before a row address strobe signal (RASB) is enabled from a logic "low" to "high". The value of flip-flop 9 is determined according to the value of the address terminal.

FIG. 7 is a flow chart showing the test sequence of the high-speed disturb test using new address decoder and test mode selection function of the present invention. The third stage to the ninth stage are portions modified according to the new address decoder of the present invention. However, the third, fourth, eighth and ninth stages are normal memory operations with no relation with cell disturb, except that the test is applied to the plurality of word lines, in contrast to the conventional test which is applied to one word line. Accordingly, these stages do not affect disturb effect of the modified test according to the present invention.

The fifth, sixth and seventh stages are new testing method of the present invention. That is, the conventional method in which data "0" is read many times is changed into the method in which data "0" is written many times. The most important cause of the error mechanism, especially, fail mechanism, according to the disturb test, is the phenomenon in which hole current generated due to the silicon pit partially increases the potential of the substrate. Accordingly, even if the operation for activating the word line is changed from reading data "0" into writing data "0", the hole current due to the silicon pit is not changed, and the same error can be detected.

Moreover, in case that the interval between the selected word lines is uniformly fixed, the word lines which are close to each other do not interfere to each other when the substrate potential is partially increased. Even though they interfere to each other, the generation of error is accelerated, producing more soft errors. In order to maintain the interval between the selected word lines, the high-speed disturb selection circuits must be sequentially added to the address bits from the most significant bit.

According to the present invention, the word lines, which are selected according to the location where the disturb selection circuit is added, operate the same sense amplifier, thereby preventing peak current from flowing excessively. As described above, the modified high-speed disturb test according to the present invention can reduce its test time.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for high-speed disturb testing of memory cells in a semiconductor device, comprising:
    operating the semiconductor device in a normal operating mode where external addresses access unique word locations;
    writing data values into the memory cells;
    reading and confirming the data values from the memory cells;
    changing the semiconductor from a normal operating mode to a disturb test mode where the external addresses each access a set of multiple word locations at the same time in an equally-spaced non-contiguous word location pattern and changing a bit value in one of the external addresses accesses a different set of multiple word locations but in the same non-contiguous word location pattern; and
    repeatedly accessing and confirming data values in the memory cells accessed by the multiple word locations according to the non-contiguous pattern defined by the disturb test mode thereby reducing disturb testing time.

2. A method according to claim 1 including the following steps:
    writing a first data value into each memory cell in the semiconductor device while in the normal mode;
    reading and confirming the first data value is written in each memory cell in the semiconductor device;
    writing a second data value into memory cells activated by disturb word lines used for disturb testing;
    reading and confirming the second data value from each of the memory cells activated by the disturb word lines;
    changing the semiconductor device from the normal mode to the test mode;
    repeatedly writing the second data value in each of the memory cells activated with the disturb word lines;
    changing the semiconductor device from the test mode to the normal mode;
    refreshing all of said memory cells;
    reading and confirming the first data value in at least one of the memory cells next to one of the memory cells activated with the disturb word lines; and
    writing the first data value into the memory cells activated with the disturb word lines.

3. The method according to claim 2 including the following steps:
    using all word lines in the semiconductor device for disturb testing;
    repeating all the steps in claim 2 for each disturb word line in the semiconductor device one by one; and
    reading and confirming the first data value for all memory cells in the semiconductor device.

4. A method according to claim 2 wherein the first data value is a logic "high" state and the second data value is a logic "low" state.

5. A method according to claim 1 wherein the step of changing from the normal operating mode to the test operating mode comprises the following steps:
    detecting signals on external control lines on the semiconductor device;
    generating a disturb signal in the semiconductor device; and
    activating multiple word lines at the same time with the disturb signal.

6. A semiconductor device, comprising:
    a word line decoder receiving a plurality of external address lines and activating a plurality of word lines, the decoder activating a unique one of the word lines according to a unique value on the external address lines; and
    a disturb selection circuit coupled to the decoder the disturb selection circuit simultaneously activating a first group of multiple word lines in an equally spaced non-contiguous word location sequence for the same value on the external address lines, the disturb selection circuit causing the same non-contiguous sequence to occur in a second group of multiple word lines adjacent to the first group by changing a bit value on the external address lines.

7. A semiconductor device according to claim 6 wherein the word line decoder comprises;
    a first pre-decoder for outputting a first part of an intermediate address according to a first half of the external address lines, the first pre-decoder coupled to the disturb selection circuit for performing a disturb test;
    a second pre-decoder for outputting a second part of the intermediate address according to a second half of the external address lines;
    a main decoder for activating a corresponding word line according to the first and second part of the intermediate address;
    wherein said main decoder selects only word lines commonly holding a bit line in order to prevent a peak current from excessively flowing, said peak current being generated from simultaneous operation of a lot of sense amplifiers in case that said main decoder simultaneously selects a plurality of word lines.

8. The semiconductor device according to claim 6 wherein the word line decoder operates in one of a normal mode and a test mode according to a signal on an external control line.

9. The semiconductor device according to claim 8 wherein the disturb selection circuit comprises a flip-flop latching a test mode activation signal in the semiconductor device and holding the test mode activation signal active in the semiconductor independently of the external addresses until a deactivation signal disables the latched test mode activation signal, the flip-flop having inputs and an output, the inputs coupled to the external control line; and
    a logic circuit having a first input coupled to the output of the flip-flop, a second input coupled to the external address lines and an output selectively activating multiple word lines at the same time.

10. The semiconductor device according to claim 6 wherein the disturb selection circuit is coupled to a most significant bit of the address lines.

11. A method according to claim 1 wherein changing from the normal operating mode to the disturb test mode comprises latching a test mode activation signal in the semiconductor device and holding the test mode activation signal active in the semiconductor independently of the external addresses until a deactivation signal disables the latched test mode activation signal.

* * * * *

UNITED STATES PATENT AND TRADEMARK OFFICE
CERTIFICATE OF CORRECTION

PATENT NO. : 5,856,982
DATED : January 5, 1999
INVENTOR(S) : Byung-se So et al.

It is certified that error appears in the above-identified patent and that said Letters Patent is hereby corrected as shown below:

Delete Specification and Abstract and substitute therefore Specification and Abstract as shown on the attached pages.

Signed and Sealed this

Twenty-eighth Day of December, 2004

JON W. DUDAS
*Director of the United States Patent and Trademark Office*

United States Patent [19]

So et al.

[11] Patent No.: 5,856,982
[45] Date of Patent: Jan. 5, 1999

[54] HIGH-SPEED DISTURB TESTING METHOD AND WORD LINE DECODER IN SEMICONDUCTOR MEMORY DEVICE

[75] Inventors: Byung-se So, Seoul; Jin-ho So, Seongnam; Woo-seop Kim, Seoul; Dal-jo Lee, Suwon all of Rep. of Korea

[73] Assignee: Samsung Electronics, Co., Ltd., Suwon, Rep. of Korea

[21] Appl. No.: 08/773,787

[22] Filed: Dec. 24, 1996

[30] Foreign Application Priority Data

Dec. 29, 1995 [KR] Rep. of Korea ............... 95/64207

[51] Int. Cl.$^7$ ................................. G11C 29/00
[52] U.S. Cl. ........................... 371/21.1; 365/201
[58] Field of Search ..................... 371/21.1, 21.2, 371/22.35, 25.1, 27.5, 28; 365/201, 189.03, 230.06, 189.05, 189.04; 395/183.18, 183.01, 182.19, 182.04

[56] References Cited

U.S. PATENT DOCUMENTS

| | | | |
|---|---|---|---|
| 5,079,744 | 1/1992 | Tobita et al. | 365/201 |
| 5,289,475 | 2/1994 | Slemmer | 371/21.1 |
| 5,455,796 | 10/1995 | Inui et al. | 365/201 |
| 5,483,488 | 1/1996 | Sanada | 365/189.03 |
| 5,519,659 | 5/1996 | Tanida et al. | 365/201 |
| 5,574,693 | 11/1996 | Inui et al. | 365/201 |
| 5,629,943 | 5/1997 | McClure | 371/21.1 |
| 5,666,317 | 9/1997 | Tanida et al. | 365/201 |

*Primary Examiner*—Robert W. Beausoliel, Jr.
*Assistant Examiner*—Nadeem Iqbal
*Attorney, Agent, or Firm*—Marger, Johnson, McCollom, P.C.

[57] ABSTRACT

A high-speed disturb testing method for a semiconductor memory device is disclosed, includes the steps of: (a) writing first piece of data in all of the memory cells in the memory cell array; (b) reading and confirming the first piece data written in each memory cell of the memory cell array; (c) writing second piece data in all of the memory cells connected to the plurality of disturb word lines; (d) reading and confirming the second piece data from all of the memory cells (e) fixing the mode of the disturb word line to the test mode; (f) repeatedly writing the second piece data in all of the memory cells connected to the plurality of disturb word lines; (g) changing the test mode to the normal mode; (h) refreshing all of the memory cells; (i) reading and confirming the first piece data from a word line located close to the selected plurality of disturb word lines; (j) writing the first piece data in all of memory cells connected to the plurality of disturb word lines; (k) repeating the steps (3) to (10), to thereby apply disturb to all of the word lines one by one; and (l) reading and confirming the first piece data from the memory cell array.

11 Claims, 6 Drawing Sheets

HIGH-SPEED DISTURB TESTING METHOD AND WORD LINE DECODER IN SEMICONDUCTOR MEMORY DEVICE

BACKGROUND OF THE INVENTION

1. Field of the Invention

The present invention relates to a semiconductor memory device and, more particularly, to a word line decoder and high-speed disturb testing method, which reduces the time required for the disturb test.

2. Description of the Related Art

The development of semiconductor fabrication techniques have provided smaller more complicated circuits. A memory device becomes more dense as the number of memory cells per unit area is increased. This increase in memory device density requires more complicated and precise fabrication processes. The high density memory devices require more complicated testing procedures that require longer test times. These testing procedures are necessary to guarantee device reliability and quality.

Practically, the performance of a memory device cannot be guaranteed even though each memory cell passes a test that reads or writes data "1" or "0". A highly integrated memory device may fail or degrade in performance due to the interaction between complicated and densely arranged memory cells. How much the interaction between cells affects memory device performance depends on various factors such as memory structure, addressing circuitry, the amount of substrate resistance, the characteristics and structure of the memory cells and variations in the fabrication process. As a result, defects in memory devices appear in various forms, and tests for screening these different defects become complicated and require longer test times.

Figure 1:
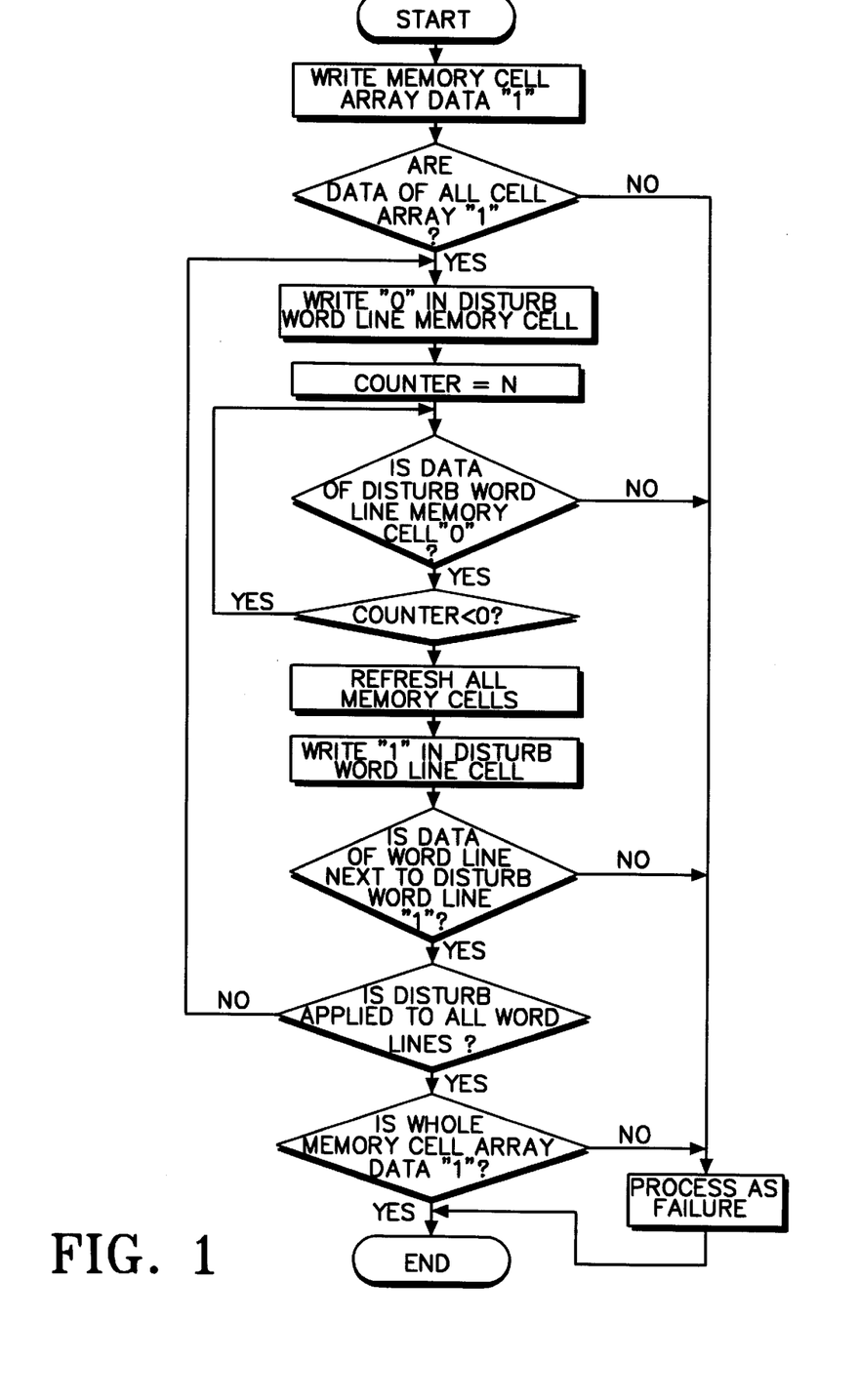
FIG. 1 is a flow chart for a conventional disturb test.

Known memory testing methods include march testing or checker board testing. The disturb test shown in FIG. 1 is effective in screening defects in DRAMs, and thus is widely used. The disturb test screens for soft errors which invert data in neighboring cells from "1" to "0". In order to determine whether the memory cells are functioning normally or have the disturb characteristics detected by FIG. 1, the same address data must be accessed repeatedly. The most important condition of the disturb test occurs when a word line is repeatedly activated (disturbed) while data "0" stored in the disturb cell and data "1" is stored in neighboring cells.

Figure 2:
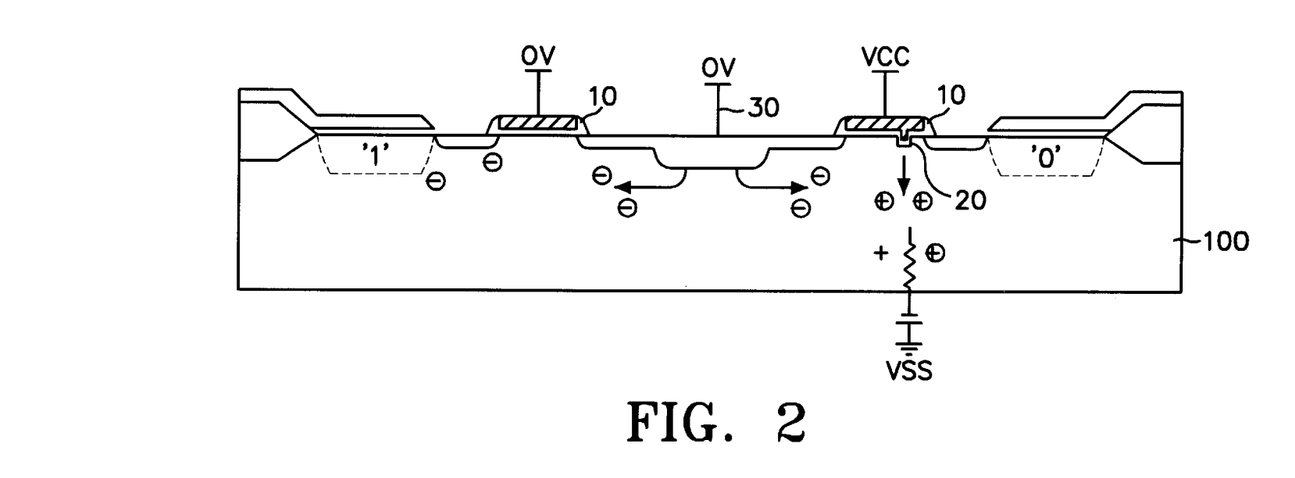
FIG. 2 is a cross-sectional view of a semiconductor showing the characteristics occurring during the disturb test.

FIG. 2 is a cross-sectional view showing the characteristics of the disturb test. A particle creates a silicon pit 20 in a gate oxide 10. During normal transistor operation, ionization from a high electric field in the silicon pit generates holes and electrons. These holes move toward a substrate 100 producing an ohmic drop in the substrate. The ohmic drop increases a substrate voltage grounding a bit line 30 at 0V forward bias. The minor carriers of electrons are injected from bit line 30 into substrate 100. The electrons are transmitted and united with holes in a neighboring cell having data "1", thereby generating a cell leakage current. As a result, a soft error is induced. When the disturb test is applied for a longer time, the error propagates in a radial manner because the electrons injected from the bit line are diffused radially.

The disturb test is based on the fact that the bit line becomes forward-biased from the partial increase of the substrate voltage. The disturb test checks this condition by repeatedly activating the word line in a predetermined data pattern. It should be noted that poor performance cells are produced locally and two poor cells distanced from each other will not interfere with each other. It is also important to activate the word line regardless of whether the activated word line reads or writes data "0".

In the aforementioned conventional disturb test, the time required for the test is long because the same word line is repeatedly activated. In the fabrication of semiconductor memory devices, fabrication costs are fixed regardless of increases in integration. However, increased integration also increases the number of cells that require testing. Thus, as the test time increases, the cost of testing increases.

Applying the disturb test to a highly integrated memory device, such as 64 megabit or 256 megabit DRAM, takes so long that it is too expensive to apply in terms of fabrication cost. On the other hand, in highly integrated memory devices, the disturb test is important for detecting high density cell errors.

SUMMARY OF THE INVENTION

An object of the present invention is to reduce the time required for disturb-testing a semiconductor memory device.

Another object of the present invention is to provide a semiconductor memory device word line decoder which can select one or multiple word lines according to a test mode.

A further object of the present invention is to provide a word line decoder that prevents excessive peak current when multiple word lines are simultaneously selected.

Another object of the present invention is to provide a word line decoder which writes data only once when the same data is written to the same bit line in a plurality of memory cells.

To accomplish the objects of the present invention, a high-speed disturb testing method is used for a semiconductor memory device. A normal mode or test mode is enabled through word lines connected to memory cells in a memory cell array. A test method according to the invention includes the steps of: (a) writing a first piece of data in all of the memory cells in the memory cell array; (b) reading and confirming the first piece of data is written in each memory cell of the memory cell array; (c) writing a second piece of data in all of the memory cells connected to a plurality of disturb word lines; (d) reading and confirming the second piece of data from all of the memory cells connected to the disturb word lines; (e) fixing the disturb word lines in the test mode; (f) repeatedly writing the second piece of data in all of the memory cells connected to the plurality of disturb word lines; (g) changing from the test mode to a normal mode; (h) refreshing all of the memory cells; (i) reading and confirming the first piece of data from word lines located close to the selected plurality of disturb word lines; (j) writing the first piece of data into all of memory cells connected to the plurality of disturb word lines; (k) repeating the steps (3) to (10), for all of the word lines one by one; and (l) reading and confirming the first piece of data from the memory cell array.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENTS

Reference will now be made in detail to the preferred embodiment of the present invention, examples are illustrated in the accompanying drawings.

The present invention reduces the time required for conducting a disturb test. The conventional disturb test disturbs one word line at a time. W×N activations are required if each word line is activated N times. However, in the present invention, $2^a$ (a is the number of address input lines) word lines are simultaneously disturbed by a high-speed disturb selection circuit. By doing so, the number of disturbance tests is reduced by $2^a$.

Figure 3:
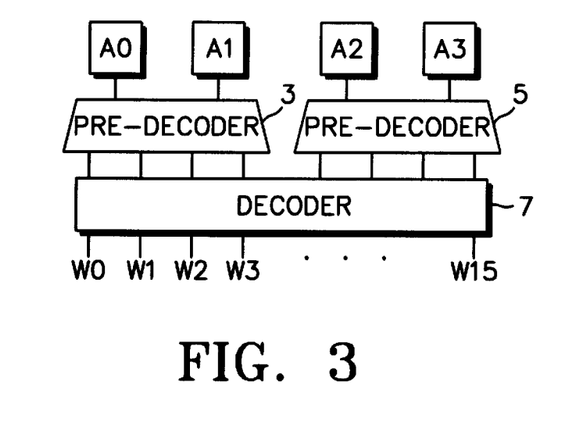
FIG. 3 is a block diagram of a word line decoder.

FIG. 3 is a block diagram of a word line decoder for a conventional memory device. The word line decoder receives four address lines (A0 to A3) and selects one of sixteen combinations of word lines. Conventionally, the word line decoder has two pre-decoders 3 and 5 and a main decoder 7. A signal sent from main decoder 7 activates one of the sixteen word lines W0 to W15 as a decoded address signal.

Figure 4:
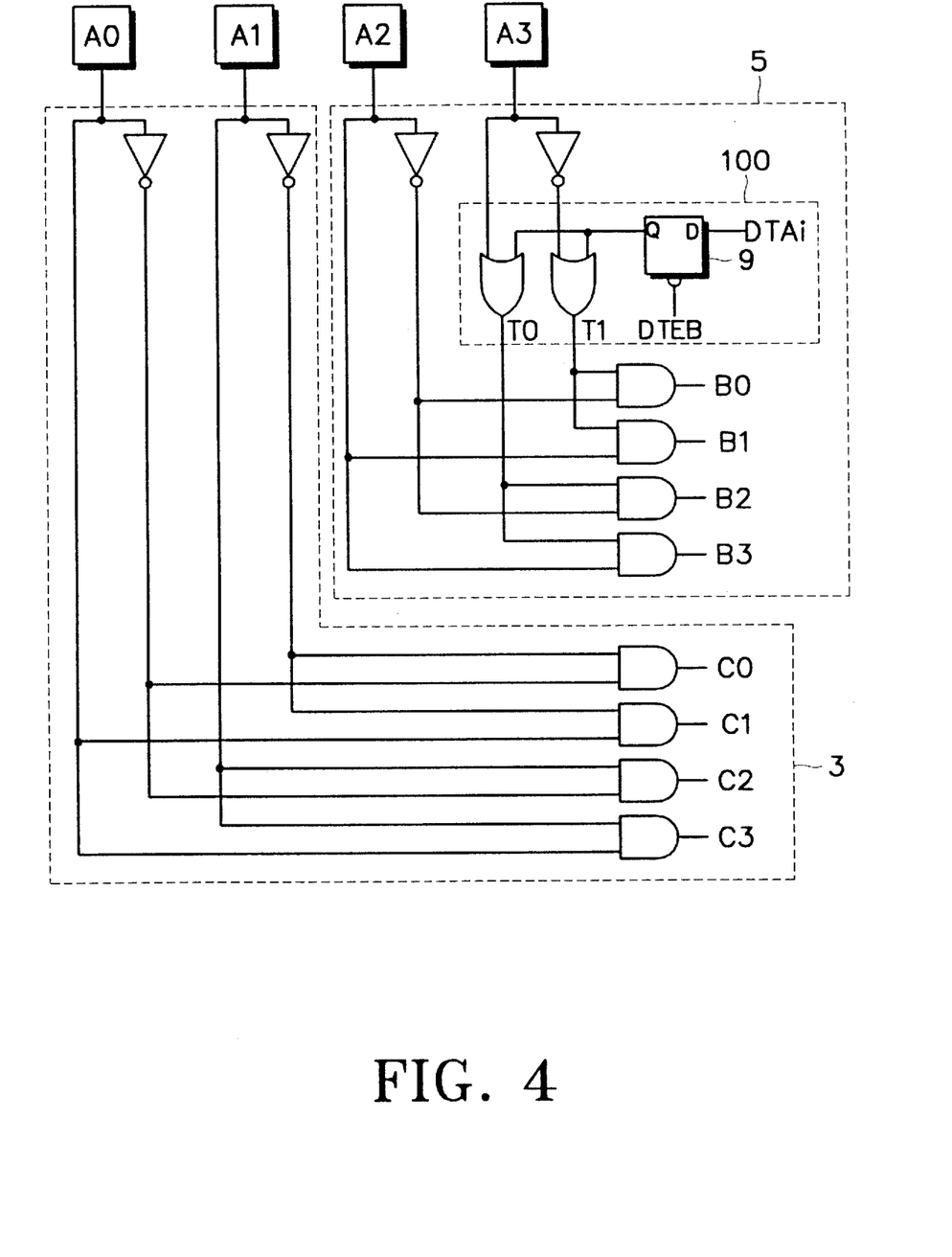
FIG. 4 is a block diagram of a pre-decoder according to one embodiment of the present invention.
Figure 5:
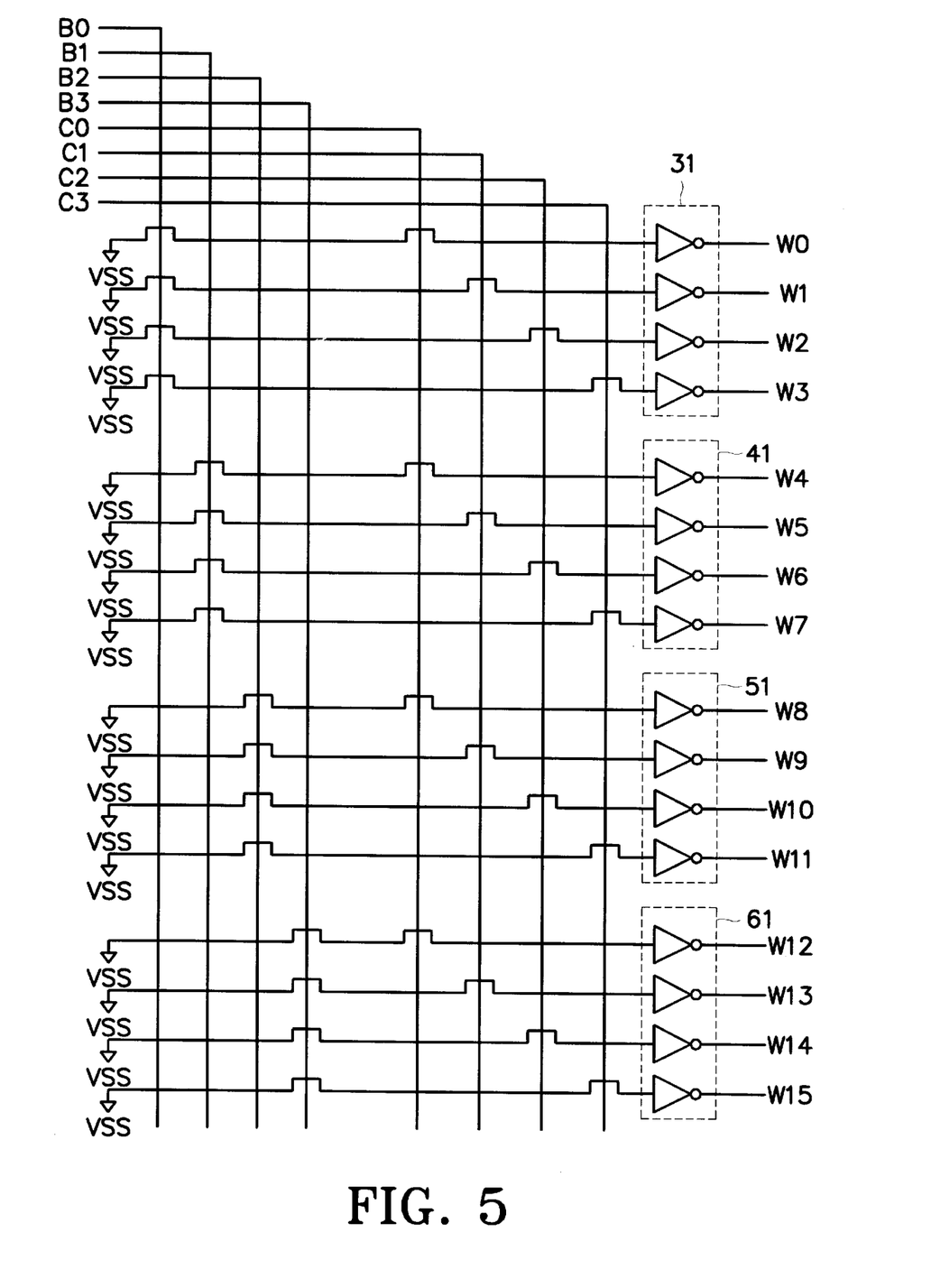
FIG. 5 is a detailed diagram of a decoder shown in FIG. 3.

FIG. 4 is one embodiment for a memory device pre-decoder according to the present invention. A high-speed disturb selection circuit 100 is located inside the pre-decoder 5. FIG. 5 is a detailed diagram of the main decoder 7 of FIG. 3.

Referring to FIGS. 4 and 5, the decoder drives one of sixteen word lines W0 to W15 according to four address inputs A0 to A3. The memory device has two modes: one is a normal mode for general reading and writing. The other mode is a test mode for high-speed disturb testing. The test mode activates a plurality of word lines by ignoring the input of a specific address pin. When output Q of a flip-flop 9 is "0", the decoder operates in the normal mode. When output Q is "1", the decoder operates in the test mode. When the decoder is operated in the normal mode, the operation of pre-decoder 3 (FIG. 4) is the same as a general pre-decoder. Since pre-decoders 3 and 5 each have four outputs, decoder 7 selects one of sixteen input combinations. In the normal mode, only one word line is selected at a time, and the decoder operates as a standard row decoder.

In the test mode, lines T0 and T1 are "1". Thus, pre-decoded addresses B0 and B2 or B1 and B3 are selected according to the value of address A2. When the pre-decoder 3, 5 is applied to decoder 7 of FIG. 5, two word lines are simultaneously selected in a manner of (W0,W8), (W1,W9), . . . , (W7,W15) according to the addresses C0 to C3. Accordingly, only eight address combinations are used in order to disturb sixteen word lines. This reduces the conventional disturbing time by one half.

If high-speed disturb selection circuit 100 is also added to address A2 in a manner similar to address A3, four word lines are selected at the same time in the manner of (W0, W4,W8,W12), (W1,W5,W9,W13), . . . ,(W3,W7,W11, W15). In this case, the total disturb time is reduced to one fourth. If the high-speed disturb selection circuit is added to address A0, two word lines are simultaneously selected. However, the word lines simultaneously selected are close to each other. Thus, the disturbed word lines could cause interference between each other.

Figure 6:
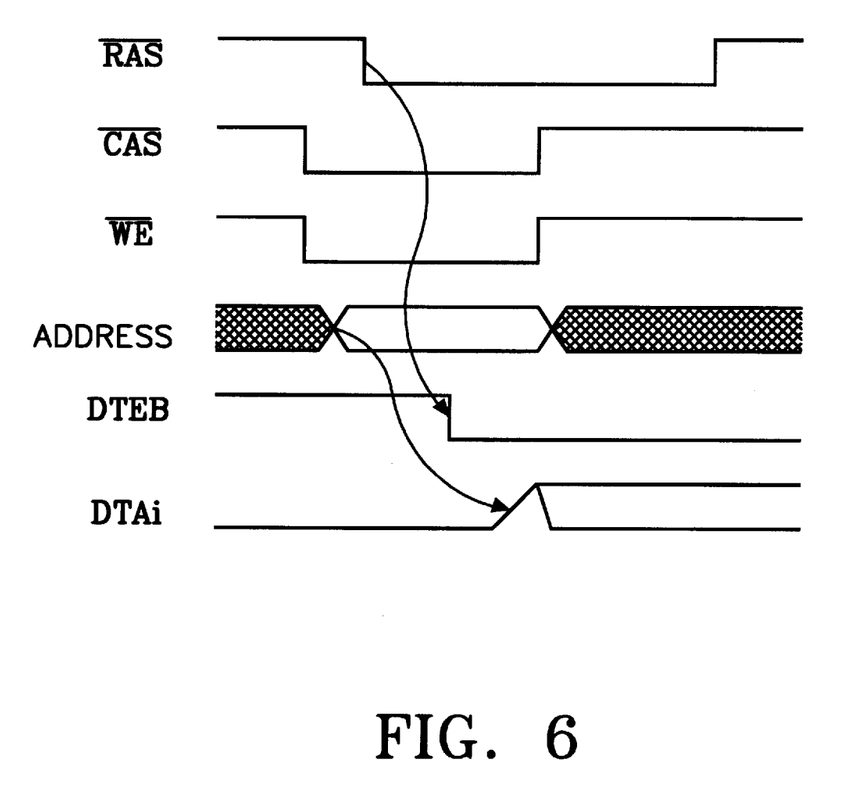
FIG. 6 is a timing diagram for a test mode according to the present invention.

FIG. 6 is a timing diagram for external signals that control the test mode in the high-speed disturb selection circuit 100. Changing into the test mode is accomplished by changing the value of flip-flop 9 of FIG. 4. Flip-flop 9 of high-speed disturb selection circuit 100 is enabled by activating a column address strobe signal (CAS) and write enable signal (WE) from a "high" to "low" before a row address strobe signal (RAS) is enabled from a "high" to "low". The data loaded into flip-flop 9 on DTAi is determined according to the value of the address lines.

Figure 7:
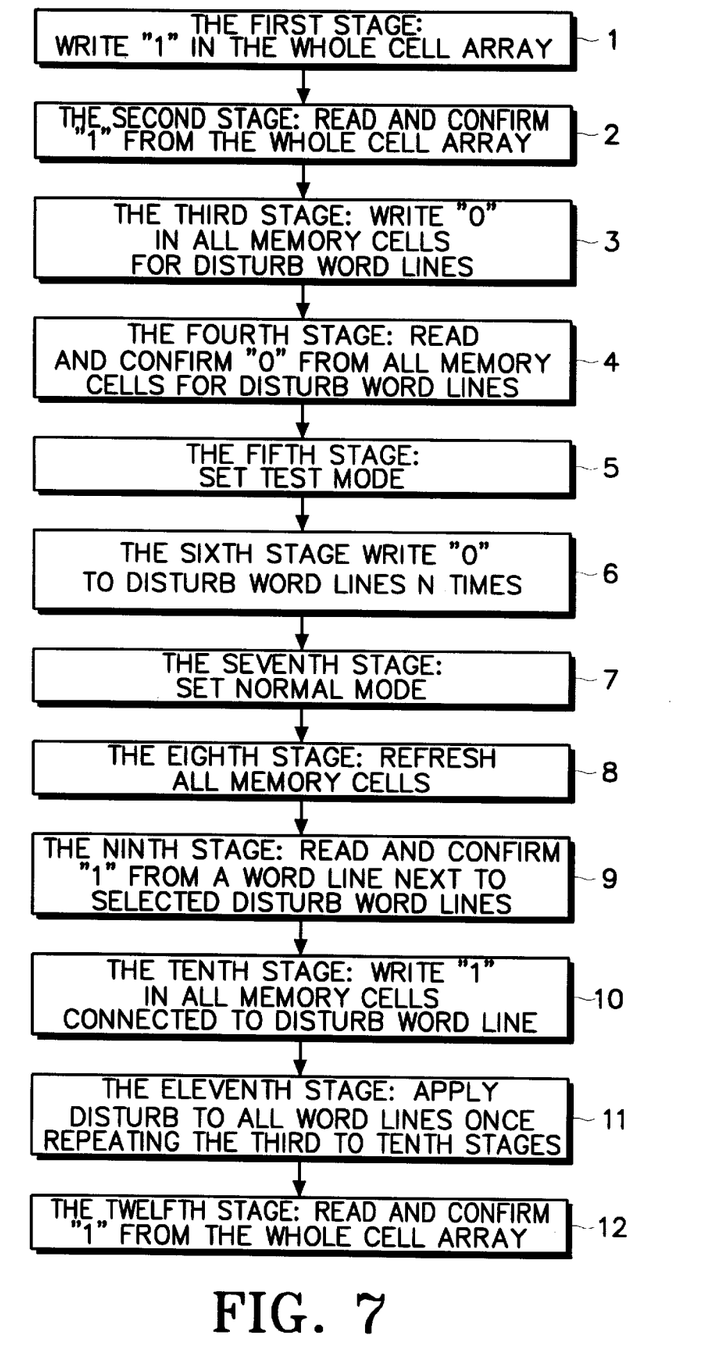
FIG. 7 is a flow chart of a high-speed disturb test according to the present invention.

FIG. 7 is a flow chart showing the test sequence of the high-speed disturb test using the new address decoder and test mode selection function of the present invention. The third stage through the ninth stage are portions modified according to the new address decoder of the present invention. However, the third, fourth, eighth and ninth stages are normal memory operations with no relation with cell disturb.

The fifth, sixth and seventh stages are new testing methods for the present invention. The conventional method in which data "0" is read many times is changed into the method in which data "0" is written many times. The most important cause of the errors induced by the disturb test is from the hole current generated from silicon pits, which partially increase the voltage potential of the substrate. Accordingly, even if the operation for activating the word line is changed from reading data "0" to writing data "0", the hole current from the silicon pit is not changed, and the same error can be detected.

When the interval between the selected word lines is uniformly fixed, the word lines do not interfere with each other when the substrate potential is partially increased. When the word lines interfere with each other, the generation of error is accelerated, producing more soft errors. In order to maintain the interval between the selected word lines, the high-speed disturb selection circuit is sequentially applied to the most significant bit.

According to the present invention, the word lines are selected according to the location where the disturb selection circuit is added in order to operate the same sense amplifier. This prevents excessive peak current from flowing. As described above, the modified high-speed disturb test according to the present invention reduces test time.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for high-speed disturb testing of memory cells in a semiconductor device, comprising:

operating the semiconductor device in a normal operating mode where external addresses access unique word locations;

writing data values into the memory cells;

reading and confirming the data values from the memory cells;

changing the semiconductor from a normal operating mode to a disturb test mode where the external addresses each access a set of multiple word locations at the same time in an equally-spaced non-contiguous word location pattern and changing a bit value in one of the external addresses accesses a different set of multiple word locations but in the same non-contiguous word location pattern; and repeatedly accessing and confirming data values in the memory cells accessed by the multiple word locations according to the non-contiguous pattern defined by the disturb test mode thereby reducing disturb testing time.

2. A method according to claim 1 including the following steps:

writing a first data value into each memory cell in the semiconductor device while in the normal mode;

reading and confirming the first data value is written in each memory cell in the semiconductor device;

writing a second data value into memory cells activated by disturb word lines used for disturb testing;

reading and confirming the second data value from each of the memory cells activated by the disturb word lines;

changing the semiconductor device from the normal mode to the test mode;

repeatedly writing the second data value in each of the memory cells activated with the disturb word lines;

changing the semiconductor device from the test mode to the normal mode;

refreshing all of said memory cells;

reading and confirming the first data value in at least one of the memory cells next to one of the memory cells activated with the disturb word lines; and writing the first data value into the memory cells activated with the disturb word lines.

3. The method according to claim 2 including the following steps:

using all word lines in the semiconductor device for disturb testing;

repeating all the steps in claim 2 for each disturb word line in the semiconductor device one by one; and reading and confirming the first data value for all memory cells in the semiconductor device.

4. A method according to claim 2 wherein the first data value is a logic "high" state and the second data value is a logic "low" state.

5. A method according to claim 1 wherein the step of changing from the normal operating mode to the test operating mode comprises the following steps:

detecting signals on external control lines on the semiconductor device;

generating a disturb signal in the semiconductor device; and activating multiple word lines at the same time with the disturb signal.

6. A semiconductor device, comprising:

a word line decoder receiving a plurality of external address lines and activating a plurality of word lines, the decoder activating a unique one of the word lines according to a unique value on the external address lines; and a disturb selection circuit coupled to the decoder the disturb selection circuit simultaneously activating a first group of multiple word lines in an equally spaced non-contiguous word location sequence for the same value on the external address lines, the disturb selection circuit causing the same non-contiguous sequence to occur in a second group of multiple word lines adjacent to the first group by changing a bit value on the external address lines.

7. A semiconductor device according to claim 6 wherein the word line decoder comprises;

a first pre-decoder for outputting a first part of an intermediate address according to a first half of the external address lines, the first pre-decoder coupled to the disturb selection circuit for performing a disturb test;

a second pre-decoder for outputting a second part of the intermediate address according to a second half of the external address lines;

a main decoder for activating a corresponding word line according to the first and second part of the intermediate address;

wherein said main decoder selects only word lines commonly holding a bit line in order to prevent a peak current from excessively flowing, said peak current being generated from simultaneous operation of a lot of sense amplifiers in case that said main decoder simultaneously selects a plurality of word lines.

8. The semiconductor device according to claim 6 wherein the word line decoder operates in one of a normal mode and a test mode according to a signal on an external control line.

9. The semiconductor device according to claim 8 wherein the disturb selection circuit comprises a flip-flop latching a test mode activation signal in the semiconductor device and holding the test mode activation signal active in the semiconductor independently of the external addresses until a deactivation signal disables the latched test mode activation signal, the flip-flop having inputs and an output, the inputs coupled to the external control line; and a logic circuit having a first input coupled to the output of the flip-flop, a second input coupled to the external address lines and an output selectively activating multiple word lines at the same time.

10. The semiconductor device according to claim 6 wherein the disturb selection circuit is coupled to a most significant bit of the address lines.

11. A method according to claim 1 wherein changing from the normal operating mode to the disturb test mode comprises latching a test mode activation signal in the semiconductor device and holding the test mode activation signal active in the semiconductor independently of the external addresses until a deactivation signal disables the latched test mode activation signal.

* * * * *